(12) United States Patent
Endo

(10) Patent No.: US 9,299,544 B2
(45) Date of Patent: Mar. 29, 2016

(54) SPUTTERING APPARATUS

(75) Inventor: Tetsuya Endo, Komae (JP)

(73) Assignee: CANON ANELVA CORPORATION, Kawasaki-Shi, Kanagawa-Ken (JP)

( * ) Notice: Subject to any disclaimer, the term of this patent is extended or adjusted under 35 U.S.C. 154(b) by 196 days.

(21) Appl. No.: 13/334,859

(22) Filed: Dec. 22, 2011

(65) Prior Publication Data

US 2012/0160672 A1 Jun. 28, 2012

(30) Foreign Application Priority Data

Dec. 28, 2010 (JP) .................................. 2010-293524
Dec. 8, 2011 (JP) .................................. 2011-269376

(51) Int. Cl.

| C23C 14/00 | (2006.01) |
|---|---|
| C25B 11/00 | (2006.01) |
| C25B 13/00 | (2006.01) |
| H01J 37/34 | (2006.01) |
| C23C 14/34 | (2006.01) |
| C23C 14/35 | (2006.01) |

(52) U.S. Cl.
CPC ......... *H01J 37/3455* (2013.01); *C23C 14/3407* (2013.01); *C23C 14/35* (2013.01); *H01J 37/3405* (2013.01); *H01J 37/3435* (2013.01)

(58) Field of Classification Search
CPC . C23C 14/3407; C23C 14/35; H01J 37/3435; H01J 37/3405; H01J 37/3455
USPC .......................................... 204/298.17, 298.2
See application file for complete search history.

(56) References Cited

U.S. PATENT DOCUMENTS

| 4,192,357 | A | * | 3/1980 | Tanaka et al. .................. 139/450 |
|---|---|---|---|---|
| 4,620,905 | A | * | 11/1986 | Tarcy et al. ..................... 205/387 |
| 5,676,810 | A | * | 10/1997 | Schwendener .......... 204/298.09 |
| 5,683,560 | A | * | 11/1997 | Szczyrbowski et al. . 204/298.23 |
| 8,592,712 | B2 | | 11/2013 | Fujisato et al. |
| 2005/0133361 | A1 | * | 6/2005 | Ding et al. ............... 204/298.18 |
| 2010/0244350 | A1 | | 9/2010 | Fujisato et al. |
| 2011/0259733 | A1 | * | 10/2011 | Watanabe et al. ......... 204/192.12 |

FOREIGN PATENT DOCUMENTS

| JP | 59-20469 A | 2/1984 |
|---|---|---|
| JP | 62-1867 A | 1/1987 |
| JP | 62-136565 A | 6/1987 |

(Continued)

OTHER PUBLICATIONS

Abstract of JP 05-311430 A.*

(Continued)

*Primary Examiner* — Ibrahime A Abraham
(74) *Attorney, Agent, or Firm* — Buchanan Ingersoll & Rooney PC

(57) ABSTRACT

A sputtering apparatus includes a target electrode capable of mounting a target, a first support member which supports the target electrode, a magnet unit which forms a magnetic field on a surface of the target, a second support member which supports the magnet unit, and a force generation portion which is provided between the first support member and the second support member, and generates a second force in a direction opposite to a first force that acts on the second support member by an action of the magnetic field formed between the target and the magnet unit, wherein the second force has a magnitude which increases as the magnet unit comes closer to the target electrode.

9 Claims, 9 Drawing Sheets

(56) References Cited

FOREIGN PATENT DOCUMENTS

| JP | 05-311430 A | * 11/1993 | .............. C23C 14/35 |
|----|---|---|---|
| JP | 2769572 B2 | 6/1998 | |
| JP | 11-302840 A | 11/1999 | |
| JP | 2006-124760 A | 5/2006 | |
| JP | 2009-516776 A | 4/2009 | |
| JP | 2010-219354 A | 9/2010 | |
| WO | 2007/059347 A2 | 5/2007 | |
| WO | WO 2010/076862 A1 | 7/2010 | |

OTHER PUBLICATIONS

Office Action issued on Aug. 31, 2015, by the Japanese Patent Office in corresponding Japanese Patent Application No. 2011-269376, and an English translation of the Office Action. (11 pages).

* cited by examiner

SPUTTERING APPARATUS

BACKGROUND OF THE INVENTION

1. Field of the Invention

The present invention relates to a sputtering apparatus having a magnet unit.

2. Description of the Related Art

A certain type of sputtering apparatus controls the plasma generation state on the discharge surface of a target using a magnet unit arranged on the back surface of a cathode electrode which supports the target (see Japanese Patent No. 02769572 and WO/2010/076862).

In an apparatus that uses a magnet unit, it is difficult to remove a target due to the presence of a force (an attractive force in many cases) acting between the magnet unit and the target in target replacement. Hence, the target is often replaced after the magnet unit is moved away from the target using, for example, a driving mechanism.

Also, Japanese Patent No. 2769572 and WO2010/076862 disclose apparatuses that perform, for example, control to move the magnet unit further away from the target in proportion to the time for which the target is used, thereby adjusting the magnetic flux density on the target surface even if this surface is eroded due to the long-term use of the target.

The sputtering apparatus as described above is also used in a process of manufacturing a device including a magnetic film, such as a magnetic head, a magnetic medium, or an MRAM device. However, in this case, a large number of lines of magnetic force generated by the magnet unit are shielded inside the magnetic target, thus making it difficult to obtain a magnetic flux density required for discharge on the target surface. To prevent this, in recent years, when a magnetic target is used, a magnet material having a high energy product is adopted as the magnet material used for the magnet unit.

Unfortunately, an attractive force as large as, for example, 6,000 N or more acts between the magnetic target and the magnet unit which produces such a strong magnetic force. The attractive force increases as the target is made thicker to improve the operating rate of a film forming apparatus.

In such a case, when the magnet unit is driven with the driving capacity of the conventional apparatus, it is possible to increase, for example, the reduction ratio between a motor and a rectilinear motion conversion mechanism, but this prolongs the process stop time. It is also possible to improve the rated power of a driving source. However, because the attractive force considerably changes even if the distance between the magnet unit and the magnetic target changes by only several millimeters, it is inefficient to match the rated power of the driving source with a maximum attractive force that acts between them.

Japanese Patent No. 02769572 and WO/2010/076862 propose no solution to the above-mentioned problem resulting from the presence of an attractive force acting between the magnet unit and the target or a backing plate formed by a magnetic material.

SUMMARY OF THE INVENTION

The present invention provides a technique advantageous in reducing, for example, the load of an apparatus due to the presence of a force such as an attractive force acting between a magnet unit and a target or magnetic material.

One of the aspects of the present invention provides a sputtering apparatus comprising: a target electrode capable of mounting a target; a first support member which supports the target electrode; a magnet unit which forms a magnetic field on a surface of the target; a second support member which supports the magnet unit; and a force generation portion which is provided between the first support member and the second support member, and generates a second force in a direction opposite to a first force that acts on the second support member by an action of the magnetic field formed between the target and the magnet unit, wherein the second force has a magnitude which increases as the magnet unit comes closer to the target electrode.

Further features of the present invention will become apparent from the following description of exemplary embodiments with reference to the attached drawings.

DESCRIPTION OF THE EMBODIMENTS

Figure 1:
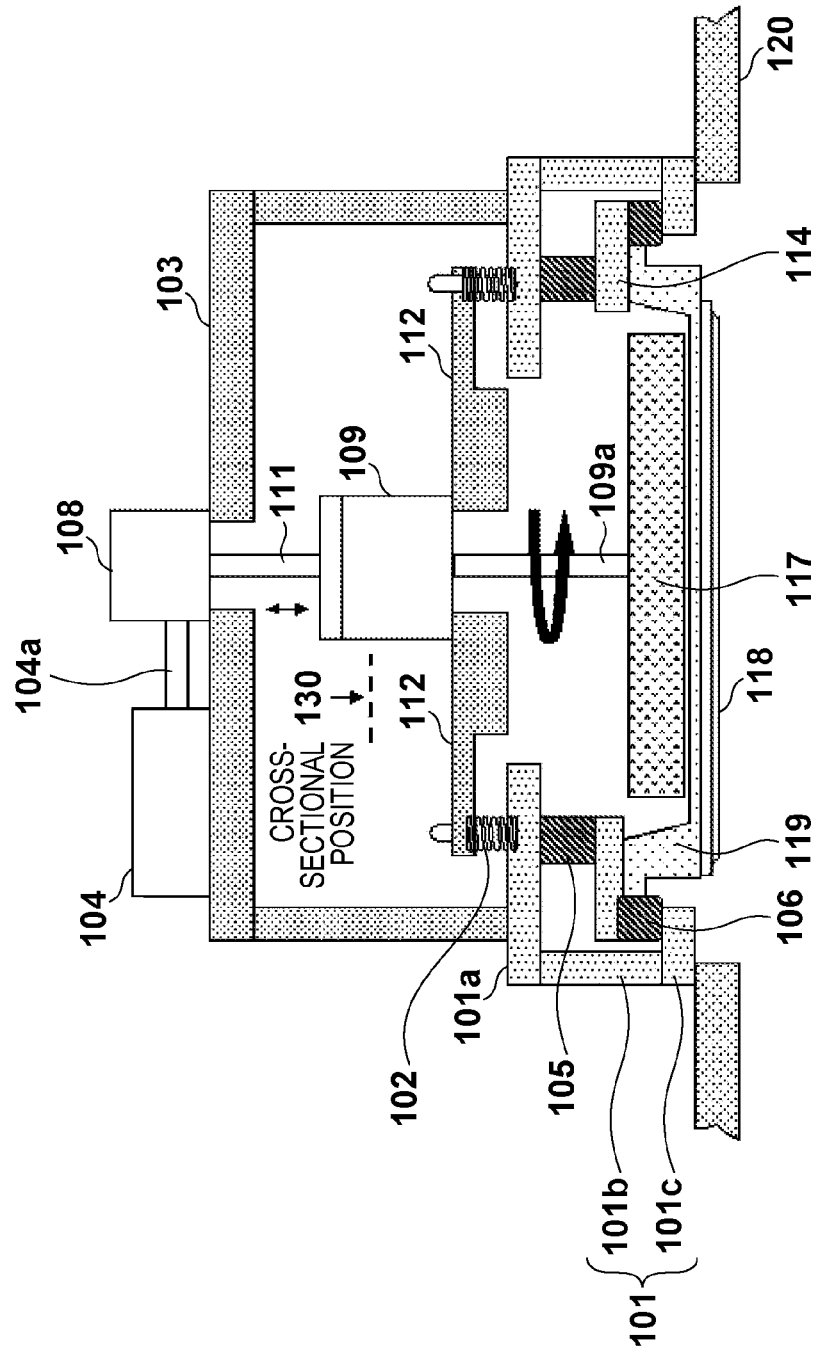
FIG. 1 is a view illustrating an example of a magnetron sputtering apparatus.

FIG. 1 is a sectional view showing the configuration of a magnetron sputtering apparatus according to an embodiment of the present invention. A target holding plate 119 serving as a target electrode which holds a target 118 is supported by a cathode body 101. The cathode body 101 includes annular members 101a and 101c and a cylindrical member 101b which connects the annular members 101a and 101c to each other. The annular members 101a and 101c and cylindrical member 101b can be assembled using, for example, screws.

A driving device is arranged on the back surface of the target holding plate 119. The driving device is used to move a magnet unit 117 vertically (in a direction away from the target holding plate 119 or that closer to the target holding plate 119) or rotate it.

The members including the cathode body 101, the target holding plate 119 and the chamber wall 120 separate, from the atmospheric environment, the vacuum environment or reduced-pressure environment under which a substrate is processed. The target 118 is fixed in position on the side of the vacuum environment or reduced-pressure environment of the target holding plate 119 by a bonding material such as indium, tin, or indium tin alloy. The target holding plate 119 is applied with a negative voltage, and the cathode body 101 and chamber wall 120 are grounded. Insulating members 105 and 106 are arranged between the target holding plate 119 and the cathode body 101 and chamber wall 120. The target holding plate 119 can be detachably mounted by, for example, screwing on a cathode support ring 114 supported via the insulating member 106 by the cathode body 101. The insulating member 105 supports the cathode support ring 114 from the back side, thereby keeping the position of the target 118 fixed even if an attractive force generated by the magnet unit 117 acts on the target 118.

The target holding plate 119 serving as a target electrode is fixed on the cathode body 101 via the insulating member 106 and cathode support ring 114. The cathode body 101 functions as a first support member which supports the target holding plate 119 serving as a target electrode via the insulating members 105 and 106 and cathode support ring 114.

The magnet unit 117 is arranged in proximity to the atmospheric air side of the target holding plate 119. The magnet unit 117 is used to form a magnetic field for generating magnetron discharge on the surface of the target 118, and connected to a rotating shaft 109a of a driving motor 109. The driving motor 109 can rotate the magnet unit 117 about an axis perpendicular to the surface of the target 118. The desirable rotation speed of the magnet unit 117 varies depending on its size, but the rotation speed of the magnet unit 117 desirably falls within the range of 60 rpm to 600 rpm. The driving motor 109 for rotating the magnet unit 117 is fixed on an annular driving base 112 by fixing components such as screws. The driving motor 109 is also connected to a jack mechanism 108 via a connection portion 111.

The jack mechanism 108 is connected to a driving motor 104 by the connection portion 111. The driving motor 104 rotates its rotating shaft 104a, and this rotation is converted into a rectilinear motion by the jack mechanism 108, thereby vertically driving the driving motor 109, driving base 112, and magnet unit 117. Note that the vertical direction is parallel to a normal to the surface of the target 118. The jack mechanism 108 includes a reducer formed by, for example, a worm gear and a worm wheel, and can vertically drive the driving motor 109, driving base 112, and magnet unit 117 upon receiving a relatively small torque. The driving motor 104 and jack mechanism 108 are fixed on a jack support member 103 supported by the driving base 112. The magnet unit 117 is supported by the driving base 112 serving as a second support member via the driving motor 109. The driving motor 104 and jack mechanism 108 function as a driving unit which moves the driving base 112 serving as a second support member to change the distance between the magnet unit 117 and the target holding plate 119 serving as a target electrode. Force generation portions (repulsive portions) 102, each of which generates a second force in a direction opposite to a first force that acts on the driving base 112 by the action of the magnetic field formed between the target 118 and the magnet unit 117, are arranged between the cathode body 101 serving as a first support member and the driving base 112 serving as a second support member. When the force generation portion 102 receives a force which acts to deform it, it generates a restoring force corresponding to the received force. More specifically, when the force generation portion 102 externally receives a force which acts to contract or flex it, it generates a force in a direction opposite to that from which it receives this force, that is, that in which it repels.

Figure 2:
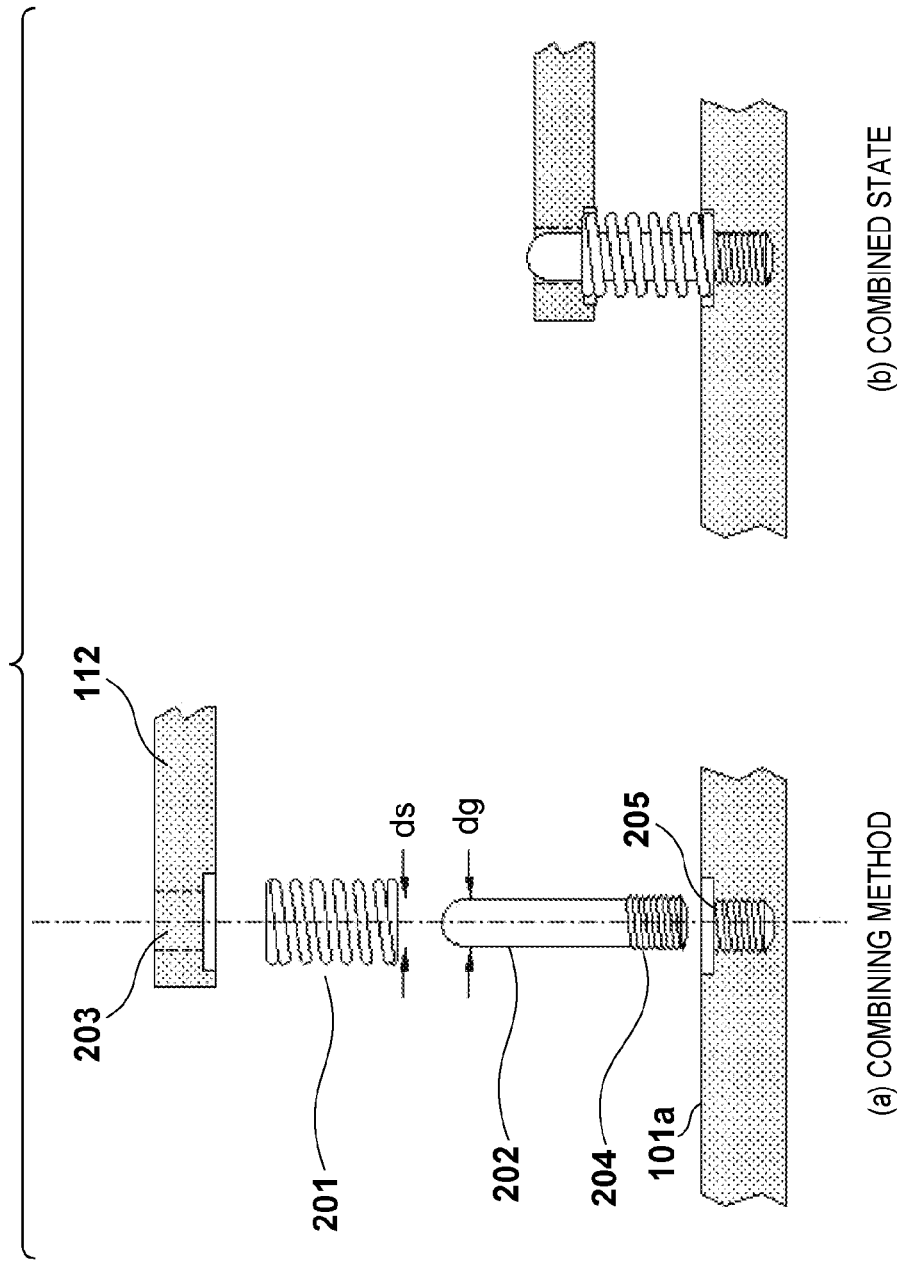
FIG. 2 shows views for explaining details of a force generation portion (repulsive portion)

The force generation portion 102 will be exemplified herein with reference to (a) and (b) in FIG. 2. The force generation portion 102 can include a guide 202 and spring (elastic member) 201. To fix the guide 202 on the surface of the annular member 101a of the cathode body 101 perpendicularly to this surface, threaded portions 204 and 205 are formed in the guide 202 and annular member 101a, respectively. By inserting the guide 202 into the spring 201, the direction in which the spring 201 operates can be corrected to the axial direction of the guide 202. A through hole 203 is formed in the driving base 112 to receive the guide 202, thereby making it possible not only to move the driving base 112 along the guide 202 but also to expand/contract the spring 201 ((b) in FIG. 2).

At this time, the inner diameter ds of the spring 201 and the outer diameter dg of the guide 202 desirably satisfy 2.0 mm≥ds−dg≥0.2 mm. If the spring 201 and guide 202 have a gap width of more than 2.0 mm, strain occurs in the spring 201 in a direction other than that in which the spring 201 operates; or if they have a gap width of less than 0.2 mm, they rub against each other, thus generating unwanted forces.

Figure 3:
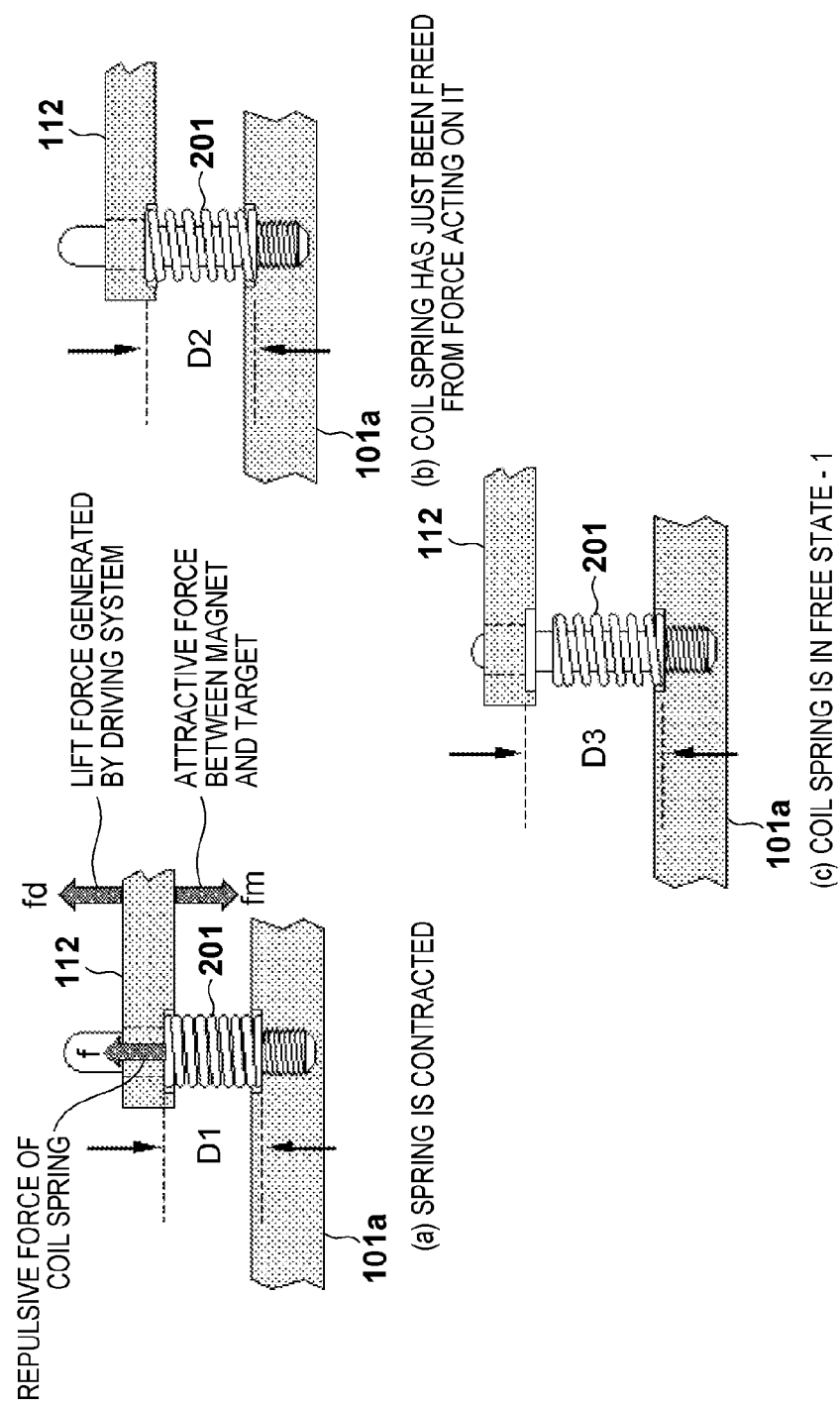
FIG. 3 shows views for explaining the operation of the force generation portion (repulsive portion)

The operation of the force generation portion 102 will be described with reference to (a), (b), and (c) in FIG. 3. (a) in FIG. 3 shows a normal state used in, for example, a film forming process, that is, the state in which the spring 201 of the force generation portion 102 is contracted to a length D1. Letting fd be the force with which the driving unit including the driving motor 104 and jack mechanism 108 drives the magnet unit 117, fm be the attractive force acting between the magnet unit 117 and the target 118, and f be the repulsive force (restoring force) of the spring 201, f+fd=fm.

(b) in FIG. 3 shows the state in which the spring 201 has just been freed from the force acting on it as the driving unit including the driving motor 104 and jack mechanism 108 separates the magnet unit 117 from the target 118. At this time, the spring 201 has a free length D2. (c) in FIG. 3 shows the state in which the magnet unit 117 is further separated from the target 118.

Figure 4:
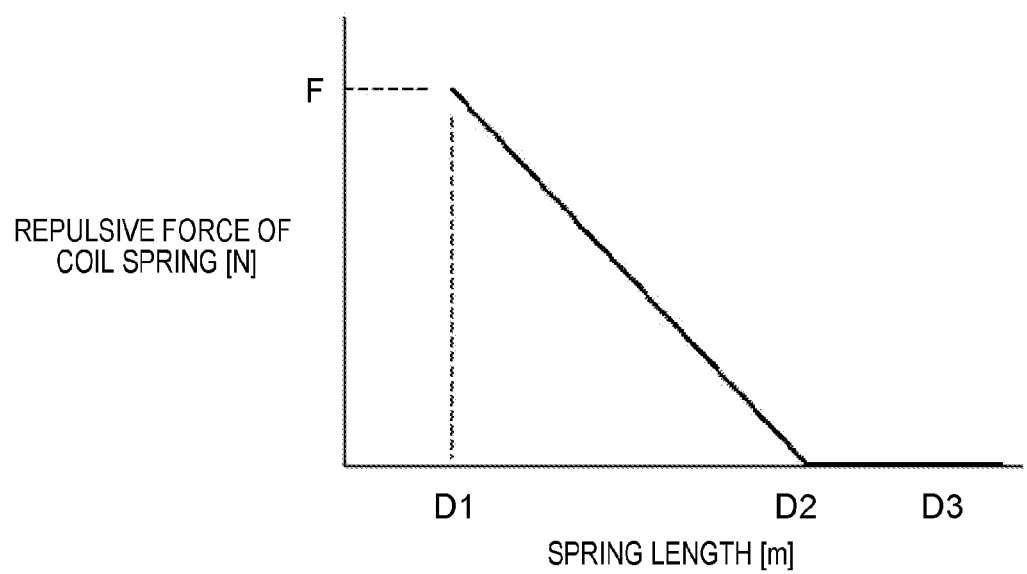
FIG. 4 is a graph showing the relationship between the length and repulsive force of a coil spring.

Until immediately before a shift is made from the state shown in (a) of FIG. 3 to that shown in (b) of FIG. 3, f=fm−fd holds because of the presence of the repulsive force generated by the spring 201. However, in (b) and (c) of FIG. 3, no force acts on the spring 201, so the driving base 112 moves only by the force generated by the driving unit including the driving motor 104 and jack mechanism 108. On the other hand, the repulsive force of the spring 201 increases in proportion to the distance by which the spring 201 contracts, as shown in FIG. 4. The spring constant of the spring 201, which is required for the above-mentioned operation, is F/(D2−D1) [N/m]. In place of a coil spring, as illustrated in FIGS. 2 and 3, other springs such as a leaf spring or a hydropneumatic spring such as a pneumatic spring can also be used.

Figure 5:
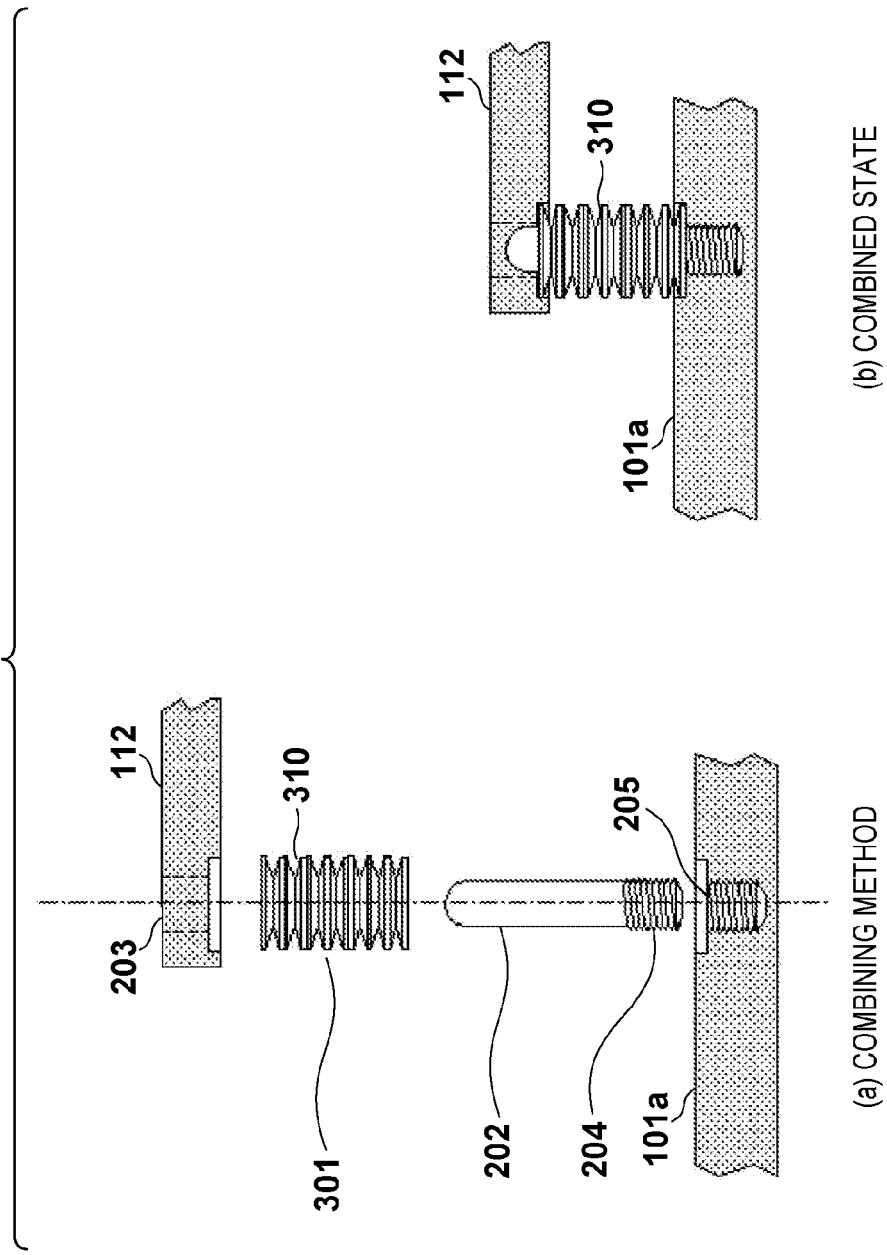
FIG. 5 shows views of the state of a combination of Belleville springs.

A Belleville spring unit 301 formed by a plurality of Belleville springs 310 can also be used as the spring of the force generation portion (repulsive portion) 102, as shown in, for example, FIG. 5. The Belleville spring 310 is formed by shaping, into a conical shape, a ring-shaped component obtained by forming a hole at the center of a disk. The Belleville spring 310 can withstand a large load even when it has a relatively low volume, and is therefore preferable from the viewpoint of space saving.

EXAMPLES

Example 1

Figure 6:
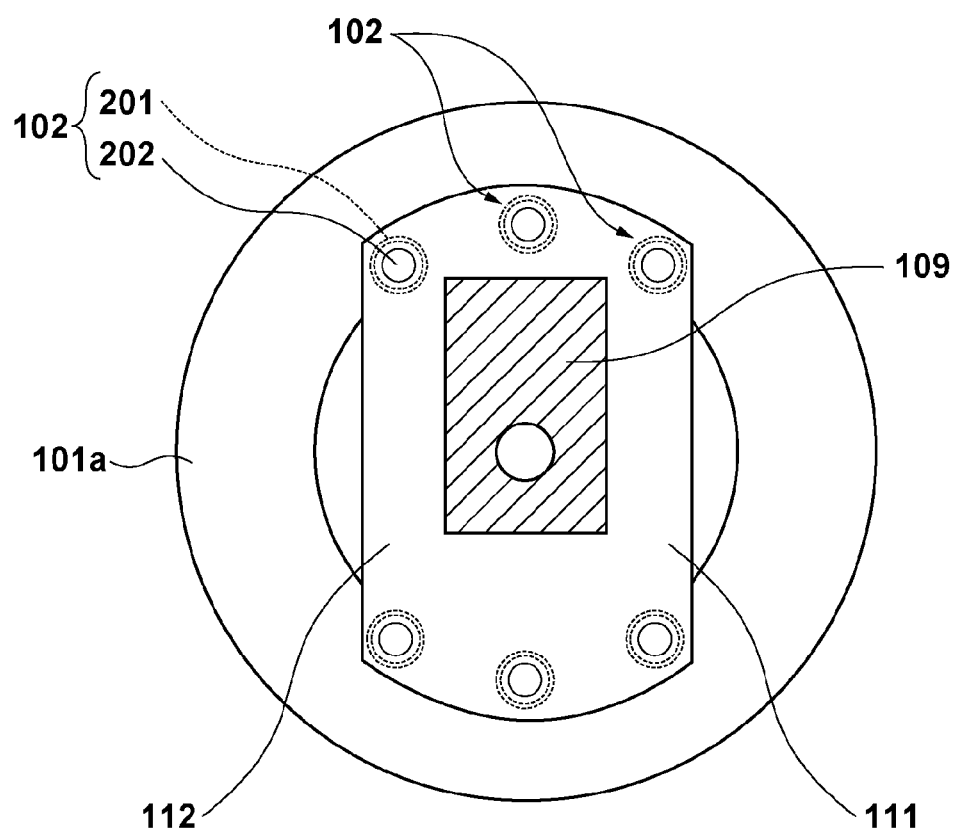
FIG. 6 is a view showing coil springs applied to the apparatus.

Example 1 according to the present invention will be described with reference to FIG. 6. FIG. 6 is a view showing a cross-sectional position 130, shown in FIG. 1, when viewed from the side of a jack mechanism 108. A driving base 112 serving as a second support member which supports a magnet unit 117 (FIG. 1) is fixed on a jack support member 103 via a driving motor 109, a connection portion 111, and the jack mechanism 108. The driving base 112 vertically moves as a motor 104 (FIG. 1) operates. Force generation portions 102, as shown in FIG. 2, are arranged at six points in FIG. 6. Each force generation portion 102 includes a spring 201 and guide 202, as described with reference to FIG. 2. A spring which generates a repulsive force of about 220 N when it flexes (contracts) by 6 mm, for example, was used as the spring 201. The six force generation portions 102 generate a repulsive force with a total magnitude of 1,320 N.

A magnet material having a size of 370 mm (diameter)×35 mm (height) and a maximum energy product of 50 MGOe was used as the magnet unit 117 (FIG. 1), FeCo (65:35 atomic percent) having a size of 376 mm (diameter)×6 mm (thickness) was used as the target 118 (FIG. 1), and the distance between the front surface of the magnet unit 117 and the back surface of the target 118 was set to 13 mm. At this time, the average magnetic flux density generated on the surface of the target 118 was 80 mT, which is sufficient for discharge.

Figure 7:
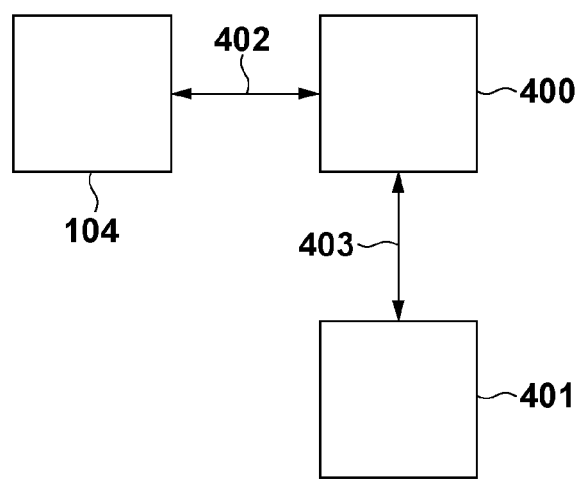
FIG. 7 is a block diagram for explaining a test method in Examples.

Springs 201 were arranged at six points, as shown in FIG. 6, so as to flex by 6 mm. In this state, the motor 104 (FIG. 1) was operated to measure its torque acting upon separation of the magnet unit 117 from the target 118. This torque was measured using a system, as shown in FIG. 7.

Figure 8:
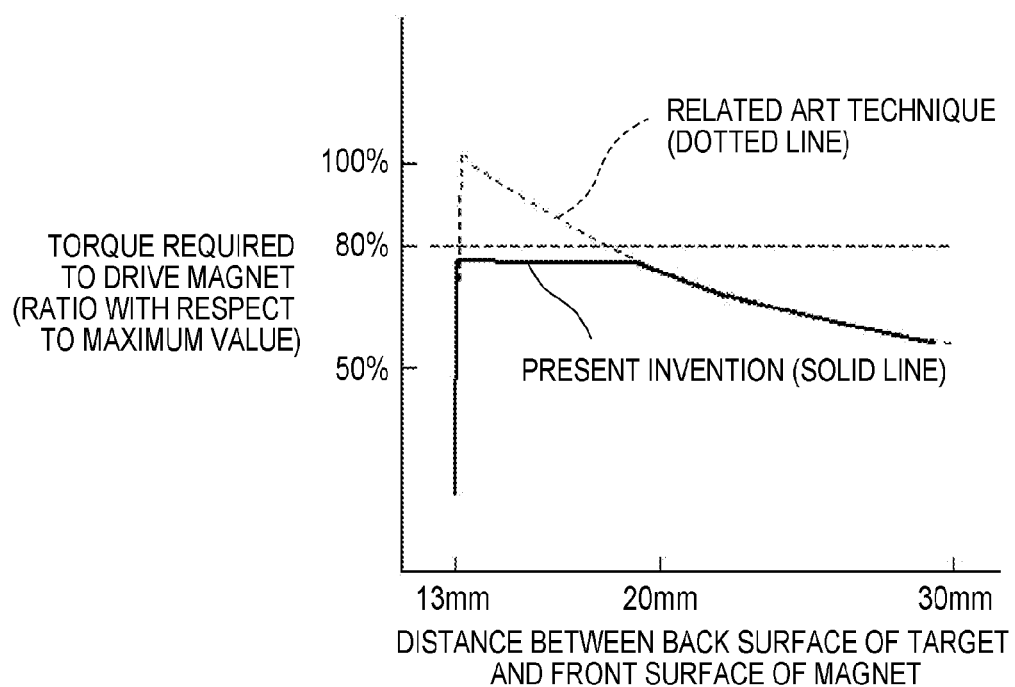
FIG. 8 is a graph showing the effect of the Examples (coil springs)

The motor 104 was controlled by a motor driver 400. A measuring device 401 could obtain the torque necessary for the motor 104 from data 403. When this torque was evaluated under the above-mentioned conditions, a result as shown in FIG. 8 could be obtained. Until the springs 201 expand to a free length from the length at which they flex by 6 mm, the torque generated by the motor 104 fluctuated around 78% assuming that the maximum torque when no force generation portions (repulsive portions) 102 are provided is 100%. Hence, the present invention made it possible to reduce the torque required for the above-mentioned operation without changing the motor 104.

Example 2

An Example in which a Belleville spring unit 301 was used as a force generation portion 102 will be described next with reference to FIGS. 5 and 9.

A driving base 112 serving as a second support member which supports a magnet unit 117 (FIG. 1) is fixed on a jack support member 103 via a connection portion 111 and a jack mechanism 108. The driving base 112 vertically moves as a driving motor 104 (FIG. 1) operates. Force generation portions 102, as shown in FIG. 5, are arranged at two points in FIG. 9. Each force generation portion 102 includes a guide 202 and a Belleville spring unit 301 formed by stacking a plurality of Belleville springs 310 on each other into an assembly.

An Example in which the Belleville springs 310 are used will be described with reference to FIG. 9. The Belleville spring unit 301 is formed by alternately stacking 20 Belleville springs on each other so that their convex surfaces face outward. Because even one Belleville spring unit 301 can withstand a large load, only two Belleville spring units 301 are used in the application example shown in FIG. 9.

A magnet material having a size of 370 mm (diameter)×35 mm (height) and a maximum energy product of 50 MGOe was used as the magnet unit 117 (FIG. 1), FeCo (65:35 atomic percent) having a size of 376 mm (diameter)×6 mm (thickness) was used as a target 118 (FIG. 1), and the distance between the front surface of the magnet unit 117 and the back surface of the target 118 was set to 13 mm. At this time, the average magnetic flux density generated on the surface of the target 118 was 80 mT, which is sufficient for discharge.

Figure 9:
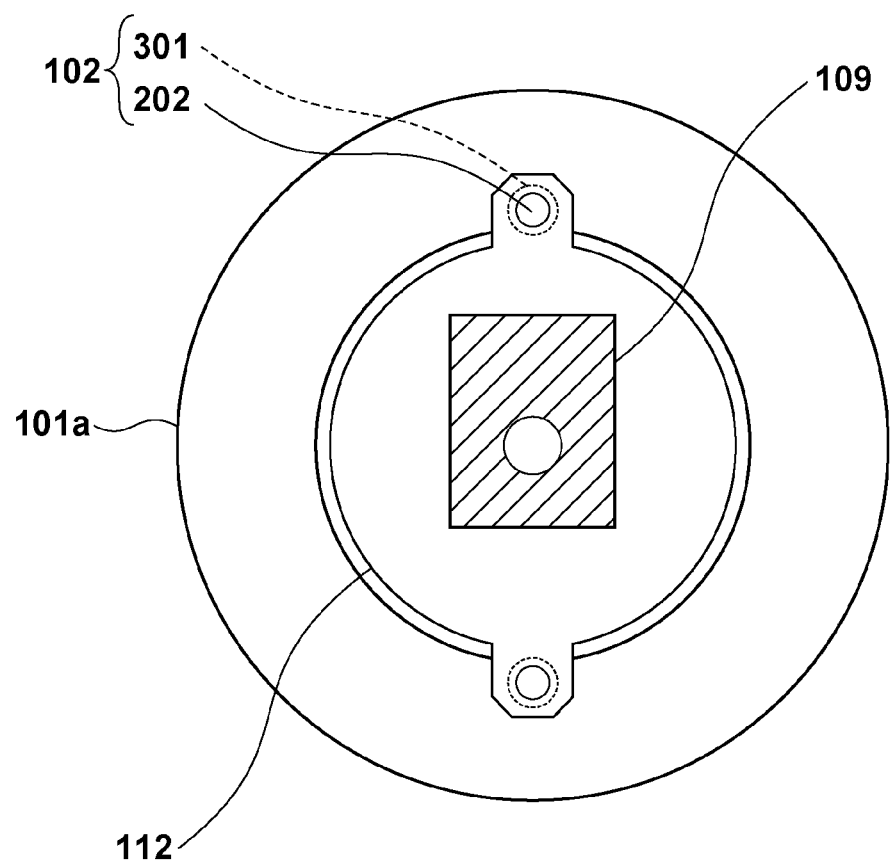
FIG. 9 is a view showing Belleville springs applied to the apparatus.

Belleville spring units 301 were arranged at two points, as shown in FIG. 9, so as to flex by 10 mm. In this state, the motor 104 (FIG. 1) was operated to measure its torque acting upon separation of the magnet unit 117 from the target 118. This torque was measured using a system, as shown in FIG. 7. The motor 104 was controlled by a motor driver 400. At the same time, a measuring device 401 could obtain the torque necessary for the motor 104 from data 403.

Figure 10:
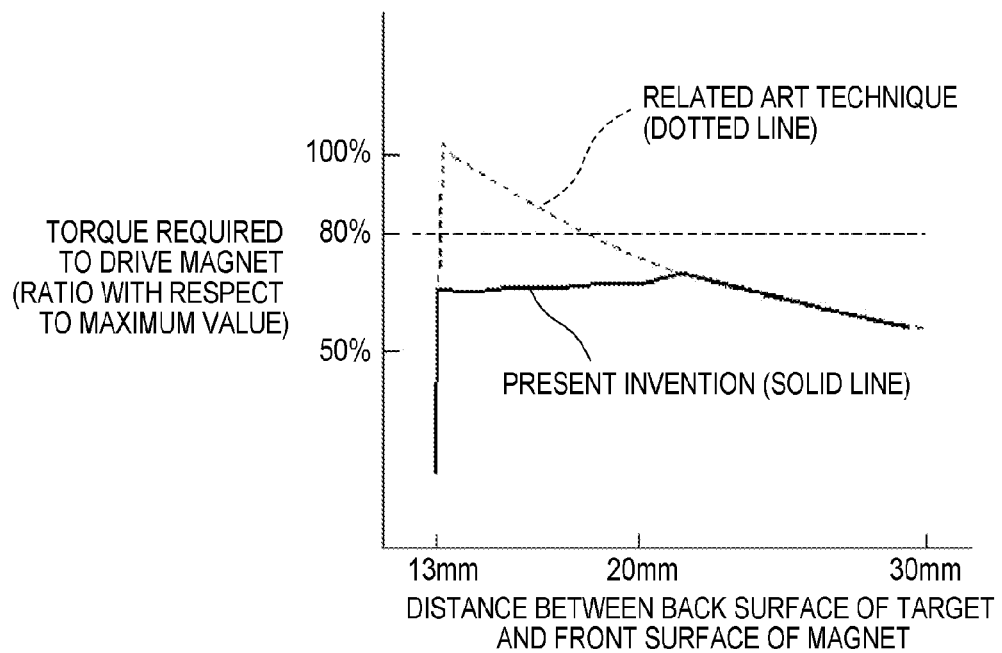
FIG. 10 is a graph showing the effect of the Examples (Belleville springs)

When this torque was evaluated under the above-mentioned conditions, a result as shown in FIG. 10 could be obtained. Until the Belleville spring units 301 expand to a free length from the length at which they flex by 10 mm, the torque generated by the motor 104 fluctuated around 66% assuming that the maximum torque when no force generation portions (repulsive portions) 102 are provided is 100%. Hence, the present invention made it possible to reduce the torque required for the above-mentioned operation without changing the motor 104.

Figure 11:
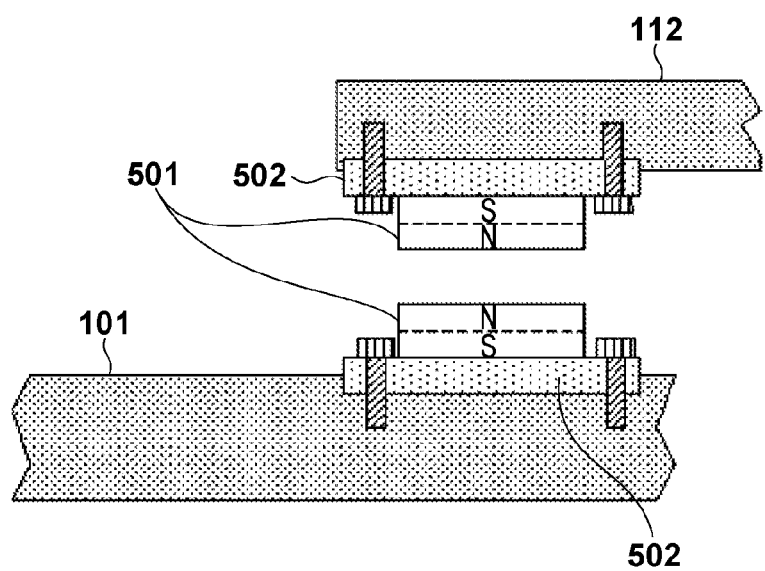
FIG. 11 is a view showing a modification to the present invention.

FIG. 11 illustrates an example in which magnets 501 are used as the force generation portions 102. The magnet 501 is fixed on the driving base 112 via a mounting portion 502 so that its north pole faces a cathode body 101 opposed to the driving base 112. Also, the magnet 501 is fixed on the cathode body 101 via a mounting portion 502 so that its north pole faces the driving base 112 opposed to the cathode body 101. Thus, a repulsive force is generated so that it increases as the north poles of the magnets 501 come closer to each other. This makes it possible to reduce the torque necessary for the motor 104 to move the magnet unit 117.

A driving unit for changing the distance between a magnet unit and a target electrode can be used as a mechanism which retracts the magnet unit in target replacement. The driving unit can also be used as a mechanism which adjusts the plasma generation state by adjusting the distance between the magnet unit and the target electrode during a process or in the interval between successive processes. However, a distance change mechanism is not indispensable.

Also, the configuration of the driving unit and the support method, for example, are not limited to the above-mentioned embodiment. For example, the driving motor 109 may be coupled to the jack support member 103 using, for example, a spring so that a larger force acts toward the jack support member 103 in a direction closer to the target 118. Moreover, a distance change mechanism may be provided on the side of the magnet unit so that a rotation mechanism integrally rotates the distance change mechanism and the magnet unit. In this case, the torque which rotates the magnet unit can also be reduced.

Referring back to FIG. 1, a target removal procedure will be described. First, the driving motor 104 is operated to rotate its rotating shaft 104a, and the jack mechanism 108 vertically moves the driving motor 109, driving base 112, and magnet unit 117. When the magnet unit 117 and target 118 are separated by a predetermined distance, the attractive force applied from the magnet unit 117 to the target 118 weakens. Screws used to fix the target holding plate 119 onto the cathode body 101 are loosened to remove the target 118, together with the target holding plate 119.

In this case, a strong attractive force acts between the target 118 and the magnet unit 117 while removing the target 118. However, according to the present invention, providing the force generation portions 102 allows a given force to act in the direction in which the driving base 112 serving as a second support member is separated from the cathode body 101 serving as a first support member. Therefore, the cathode body 101 serving as a first support member is moved upward to further reduce the load imposed on the driving unit including the motor 104 and jack mechanism 108.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-293524, filed Dec. 28, 2010, and Japanese Patent Application No. 2011-269376, filed Dec. 8, 2011, which are hereby incorporated by reference herein in their entirety.

What is claimed is:

1. A sputtering apparatus comprising:
a target electrode capable of mounting a target;
a first support which supports the target electrode;
a magnet unit which forms a magnetic field on a surface of the target;
a second support which supports the magnet unit, the second support including a motor configured to rotate a first shaft connected to the magnet unit so as to rotate the magnet unit, and a driving base configured to support the motor, the magnet unit being supported by the motor via the first shaft, wherein the magnetic field creates a first force urging the driving base of the second support in a first direction;
a driving unit which includes a second shaft connected to the motor and moves the second shaft so as to move the motor vertically such that the magnetic unit is moved vertically, the driving unit configured so as to increase a distance between the magnetic unit and the target; and
a force generation portion which is provided between the first support and the driving base of the second support, and generates a second force, the second force urges the driving base of the second support in a second direction that is opposite to the first direction, the force generation portion being configured so as to assist the driving unit in increasing the distance between the magnetic unit and the target;
wherein the second force has a magnitude which increases as the magnet unit comes closer to the target electrode;
wherein the force generation portion is one of a spring, a magnet, and an elastic member.

2. The apparatus according to claim 1,
wherein the force generation portion generates, as the second force, a force in a direction parallel to a direction in which the driving unit moves the second support.

3. The apparatus according to claim 2, wherein the force generation portion generates the second force when the distance between the target electrode and the magnet unit is not more than a predetermined distance.

4. The apparatus according to claim 1, wherein the force generation portion includes an elastic member which generates the second force.

5. The apparatus according to claim 1, wherein the force generation portion includes a spring which generates the second force.

6. The apparatus according to claim 1, wherein the force generation unit includes a magnet which generates the second force.

7. The apparatus according to claim 1, wherein the magnet unit is arranged between the driving base and the target electrode.

8. The apparatus according to claim 5,
wherein the first support includes a support member, and the driving base of the second support has a through hole,
wherein the apparatus further comprises a guide
which is connected to the support member and which is slidably inserted in the through hole so as to guide the driving base, and
wherein the spring is arranged between the support member and the driving base such that the spring is supported by the guide passing through the spring.

9. The apparatus according to claim 1, wherein the driving unit includes:
a driving motor which rotates a third shaft; and
a jack mechanism which converts a rotation of the third shaft into a rectilinear motion of the second shaft so as to move the motor vertically.

* * * * *